United States Patent

Ponte

[11] 4,250,446
[45] Feb. 10, 1981

[54] COMBINATION FLASHLIGHT AND CIRCUIT TESTER

[76] Inventor: Raymon Ponte, 16516 Kipling Rd., Rockville, Md. 20855

[21] Appl. No.: 804

[22] Filed: Jan. 4, 1979

[51] Int. Cl.³ .......................... G01R 31/00; F21L 7/00
[52] U.S. Cl. ................................. 324/53; 362/191; 362/205
[58] Field of Search .................. 324/51, 53, 72.5, 149; 362/171, 173, 178, 190, 191, 205, 202

[56] References Cited

U.S. PATENT DOCUMENTS

| | | | |
|---|---|---|---|
| 1,508,990 | 9/1924 | Schmidt | 324/53 |
| 1,648,709 | 11/1927 | Winsell | 362/191 |
| 2,205,477 | 6/1940 | James | 324/53 |
| 2,327,696 | 8/1943 | Bishop | 324/53 X |
| 2,404,735 | 7/1946 | Lippincott | 362/205 |
| 2,540,471 | 2/1951 | Borsody | 324/53 |
| 2,607,829 | 8/1952 | Tipperman | 324/53 |
| 2,912,647 | 11/1959 | Krystek | 324/72.5 |
| 2,946,003 | 7/1960 | Pryer | 324/53 |
| 3,004,217 | 10/1961 | Ciardiello | 324/53 |
| 3,145,337 | 8/1964 | Lipson | 324/53 |
| 3,194,955 | 7/1965 | Koch | 362/202 |
| 3,571,701 | 3/1971 | Lai | 324/51 |

*Primary Examiner*—Gerard R. Strecker
*Attorney, Agent, or Firm*—Haight, Rosfeld, Noble & Santa Maria

[57] ABSTRACT

A combination flashlight and circuit tester is disclosed which functions as both a conventional source of portable illumination and a circuit continuity tester employing either internal or external sources of electrical energy. An improved multidirectional support enables the flashlight/tester to be attached to a stationary structure while its flashlight beam is aimed in any one of a variety of directions. Contacts and a positively actuated switch are replaceable. A battery biasing spring is hingedly mounted to the battery casing to facilitate battery insertion and removal. A neon test lamp indicating continuity of electrical circuits is removably mounted on the exterior of the flashlight/housing to facilitate observation and replacement.

14 Claims, 4 Drawing Figures

U.S. Patent  Feb. 10, 1981  4,250,446
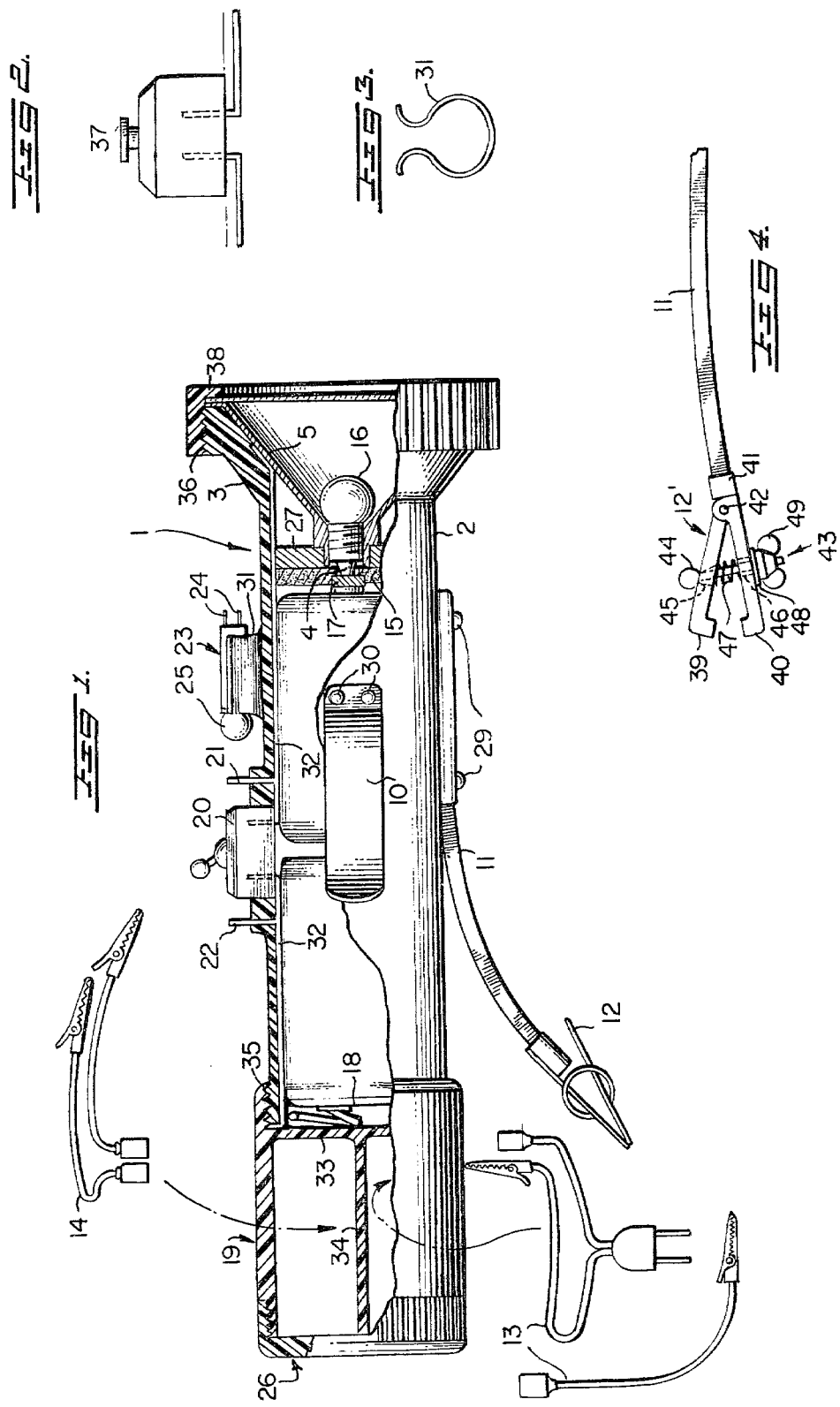

COMBINATION FLASHLIGHT AND CIRCUIT TESTER

BACKGROUND OF THE INVENTION

This invention relates to flashlights, and more specifically to combination flashlights and circuit testers.

Many deficiencies of conventional flashlights are apparent to laborers and other workmen. One of these problems is the difficulty encountered in carrying a flashlight at the same time that a task requires both of a laborer's hands for manipulation of tools and other implements. A second problem commonly encountered by users of conventional flashlights is the shortened life of batteries which are drained as a result of unintended throwing of the flashlight on-off switch. Still a third problem facing users of conventional flashlights is the short useful life of the typical flashlight bulb, which arises due to the failure to provide any structure which will preserve the contact of such a bulb. A fourth problem with conventional flashlights is that they fail to provide any means for performing simple electrical tests which would transform a flashlight into a combination device useful for a plurality of purposes.

There have been several attempts to overcome the above-mentioned problems. Winsell, U.S. Pat. No. 1,648,709, discloses one arrangement for retaining a flashlight on a desired surface in order that a workman may free his hands for performing intended tasks. This is accomplished by the use of a spring clip 28 situated at the end of a portable electric lamp opposite from the light bulb. This clip inherently limits the direction in which light can be cast by the lamp, and does not appear to be able to by itself support the electric lamp in a plurality of positions when it is attached onto any given surface.

A number of attempts have been made to develop a flashlight which is capable of testing various circuits. For example, the device of Costello, U.S. Pat. No. 2,846,644, uses flashlight batteries for indicating the continuity of certain electric circuits, while also including a neon bulb 72 for testing the continuity of a high resistance circuit by using an external source of current. Costello, however, fails to suggest or provide a compartment for retaining a plurality of tester cables to be used in conjunction with the two aforementioned tests and does not include any structure for supporting the combination flashlight when such a test is being performed. Nor does the flashlight of Costello include any structure capable of extending either flashlight battery or flashlight bulb useful life other than that found in the conventional flashlight. Another flashlight which utilizes a plurality of indicating bulbs for different electrical tests is disclosed by Marinello, U.S. Pat. No. 2,564,166. This flashlight includes a plurality of external terminals to which testers may be attached in order to test the continuity of a desired circuit but does not solve the other problems noted above, nor does this flashlight provide easily accessible means for testing a circuit which are removably attached to the outside of a flashlight housing. Tipperman, U.S. Pat. No. 2,607,829, discloses a combination flashlight which includes means for testing the continuity of a single circuit. The testing cords 28 of Tipperman are stored within screw on compartment 29 located at the lower end of the flashlight casing 11. Another lamp device for testing the continuity of the plurality of circuits is shown by Harmon, U.S. Pat. No. 3,553,572. While this device does include means for testing the continuity of a plurality of circuits, it is not really designed for use as a flashlight, and the shape and bulk of the flashlight body render it unwieldy for use as a conventional flashlight by the common laborer.

Other combination flashlights and testers which do not include different light bulbs to indicate the continuity of circuits using different sources of currents are disclosed, for example, by the following: Garrett et al., U.S. Pat. No. 3,775,677; Hayes, U.S. Pat. Nos. 3,873,915 and 3,973,193; Metcalfe, U.S. Pat. No. 4,021,732; and Duncan, U.S. Pat. No. 2,550,234. In addition to using only one circuit-test indicating bulb, none of these devices attempts to overcome the aforementioned problems with respect to support, battery life or flashlight bulb life.

Lippincott, U.S. Pat. No. 2,404,735, discloses the use of a toggle switch 15 near the head of flashlight casing 11. Nowhere within the disclosure of Lippencott, however, is the use of such a toggle switch mentioned for the purpose of extending battery life in a flashlight.

While all of the above-noted devices attempt to overcome piecemeal some of the problems associated with conventional flashlights, none of them has been able to simply solve all of the listed problems as simply as the present invention. In addition to the aforementioned problems, it would be desirable to provide means for facilitating the insertion and removal of batteries in the flashlight casing, as well as including structure for detachably carrying a neon test light along the periphery of the tubular portion of a flashlight.

OBJECTS OF THE INVENTION

Accordingly, a general object of the present invention is to provide a new and improved combination flashlight and circuit tester.

Another object of the present invention is to provide a new and improved combination flashlight and circuit tester which is capable of testing the electrical continuity of circuits utilizing the flashlight batteries as a source of current.

An additional object of the present invention is to provide a new and improved combination flashlight and circuit tester which is capable of testing the electrical continuity of circuits utilizing an external source of current.

A further object of the present invention is to provide a new and improved combination flashlight and circuit tester which is capable of preserving the life of flashlight batteries by preventing accidental manipulation of the on-off switch.

Still another object of the present invention is to provide a new and improved combination flashlight and circuit tester which will preserve and extend flashlight bulb life by protecting the flashlight bulb contact.

A yet additional object of the present invention is to provide a new and improved combination flashlight and circuit tester which is capable of being self-supporting on any one of a plurality of objects in a plurality of positions.

A still further object of the present invention is to provide a new and improved combination flashlight and circuit tester which will facilitate insertion and removal of flashlight batteries within the tubular casing.

Yet another object of the present invention is to provide a new and improved combination flashlight and circuit tester which will be simple for workmen to use and inexpensive for manufacturers to produce.

Upon further study of the specification and appended claims, further objects and advantages of this invention become apparent to those skilled in the art.

SUMMARY OF THE INVENTION

Briefly, the above and other objects of the invention are attained in one aspect thereof by providing a combination flashlight and circuit tester which includes a generally tubular cylindrical housing for holding conventional flashlight batteries. The flashlight includes at one end a screw-on lens, an annular contact plate removably engaged by the housing and a flashlight bulb removably retained within a reflector. An annular insulating plate abuts the contact plate and surrounds a bulb contact and a discoidal battery contact plate abuts the insulating plate and bulb contact on one side and abuts one of the batteries on the other. An on-off switch is provided for preserving the useful life of the flashlight batteries by preventing unintended flashlight operation. A removable cap closes the end of the housing opposite from the lens and a flexible metal rod and spring clamp are further provided for supporting the tubular casing on a variety of surfaces in a plurality of positions.

BRIEF DESCRIPTION OF THE DRAWINGS

The above and other objects, features and advantages of the present invention will be more fully appreciated as the same become better understood from the following detailed description when considered in connection with the accompanying drawings in which like reference characters designate like or corresponding parts throughout the several views, and wherein:

FIG. 1 is an elevation view, partly broken away view of the combination flashlight and circuit tester according to the present invention.

FIG. 2 is an elevation view of an on-off switch according to an alternative embodiment of the present invention.

FIG. 3 is a cross sectional view of a snap clip according to the present invention.

FIG. 4 is an elevation view of a supporting clamp according to an alternative embodiment of the present invention.

DETAILED DESCRIPTION

Referring now to FIG. 1 of the drawings, a flashlight 1 is illustrated which is comprised primarily of a plastic generally cylindrical hollow tubular housing body portion 2. Conventional flashlight batteries are held therein and several supporting devices are attached to the outside of the tubular housing or casing along its outer surface. Elongated metal clip 10 is attached to the outside of the tubular housing by means of screws, rivets or other conventional connectors 30. This clip is utilized to hang the combination flashlight and circuit tester from a belt, pocket or other suitable part of a laborer's clothing. Also attached to the outside of the tubular housing or casing 2 is a flexible metal rod 11. This rod is attached at one of its ends to the housing by means of screws, rivets or other conventional connectors 29. The end of the metal rod which is affixed to the tubular housing is immobile, while the remaining portion of the rod and its other end can be moved in a great variety of directions. Attached to the other end of the flexible rod is a spring clamp 12 which enables the flashlight tube clamped in self-supporting fashion on any one of a variety of support surfaces, such as shelves and other furniture items. Rod 11 is made from a metal which is sufficiently flexible to be twisted or turned to any desired position while at the same time being sufficiently strong so as not to fatique and move to another position unless an external force is applied to the rod and flashlight. As best seen in FIG. 3, a metal generally U-shaped snap clip 31 is also attached in a conventional fashion, such as by soldering, welding or riveting, to the outside of tubular housing 2, for a purpose to be hereinafter described. This snap clip is formed from a metal sufficiently flexible and strong that it can removably retain an article inserted therein.

At an upper end of the combination flashlight is located a portion 3 of conical cross section which flares outwardly from one end of and is wider in cross section than the cylindrical cross-section of the tubular housing. The wide base of the conical portion is located at one end of the flashlight and includes screw threads 36 so that it may removably engage a screw on lens 38. Adjacent this end of the flashlight housing a conventional flashlight bulb 16 is removably engaged by means of screw threads on the bulb and on the inside of a cylindrical portion of reflector 5. Annular metal flashbulb contact plate 27 frictionally engages the outside of the cylindrical portion of the reflector and is removably engaged by the inside of housing 2. The flashlight bulb 16 includes a contact portion 4 which extends beyond annular plate 27 and reflector 5 in the direction of the central axis of the flashlight. This contact is surrounded by annular insulating plate 15 which on one side abuts annular contact plate 27. A two-sided discoidal metal contact plate 17 is retained by a recess in plate 15 or by adhesive and abuts flashlight bulb contact 4 and annular plate 15 on one surface and a contact of the uppermost of the two batteries 28 which are held within the tubular housing 2 on its other surface. The discoidal plate 17 serves to extend the normal life of the flashlight bulb 16, as it forms a buffer between the contact of the uppermost of batteries 28 and the contact portion 4 of the flashlight bulb. The provision of this plate eliminates the direct contact between the battery and the bulb contact which normally results in shock and resultant damage to the bulb contact and a resultant shortening of flashlight bulb life.

A screw-on storage compartment 19 is removably mounted to the opposed end of the tubular housing 2. This compartment is used to retain and house cheater cords 13 and testing cords 14, which are utilized as explained hereinafter. An outer wall 33 is provided to close the end of the storage compartment which is adjacent screw threads 35 of the storage compartment, and the other end of the generally cylindrical storage compartment is closed by a removable screw-on cap 26. The compartment may be provided with an interior partition 34 to separate the tester cords from the cheater cords. When storage compartment 19 is screwably mounted on the tubular housing 2, outer wall 33 will bear upon a straight steel pressure spring 18 to force one end of the spring into abutment with one of the batteries and bias the batteries in turn into continuous contact with the discoidal contact plate 17. The straight pressure spring is generally V-shaped and at its other end is hingedly connected to a free end of one of two copper bars 32 with its other end connected to on-off toggle switch 20. The spring is hingedly connected to the copper bar so that it can be retracted from the path of batteries 28 to facilitate their insertion or withdrawal from housing 2. This arrangement enables the flashlight of the present invention to overcome the aforementioned problem of generally inaccessible batteries. The other copper bar 32 is connected at one end to on-off switch 20 and at its other end is attached to annular contact plate 27. These two bars 32, located parallel to the longitudinal central axis of cylindrical housing 2, help to complete a circuit, the purpose of which is to be hereinafter more fully explained.

Switch 20, which is located on the outside of housing 2 intermediate its ends, is designed to prevent the shortening of flashlight battery life caused by jostling of the flashlight, resulting in unintended or accidental movement of the conventional on-off slide switch and unintended operation of the flashlight. As illustrated, on-off toggle switch 20 of the instant invention is less susceptible to such unintended switching, as it requires a more positive action to be moved from the off to the on position and to thereby activate the flashlight. Alternatively, a push button switch 37, as shown in FIG. 2, may be used which would likewise be advantageous in preserving battery life. A positive spade connector 22 and a negative spade connector 21 are each located on opposed sides of the on-off switch and extend from the outside of the tubular housing through the tubular housing where they are respectively connected inside of the housing to one of the two electrically conductive copper bars 32 located within said housing. A neon test light 23 is removably retained by a generally V-shaped metal snap clip 31 which is attached to the outside of said housing. The neon test light includes two male spade connectors 24 at the end of the light opposite from the bulb portion 25 for a purpose to be more fully hereinafter explained.

As illustrated in FIG. 4, a pressure clamp 12' which includes opposed jaws 39 and 40 can be used as an alternative to spring clamp 12. The pressure clamp includes a casing 41 at one of its ends which is welded to flexible rod 11. Lower jaw 40 is in turn welded to the rod and upper jaw 39 is hinged to the lower jaw by jaw pin 42. The jaws are also adjustably connected by means of a bolt and nut arrangement 43. This arrangement includes a bolt 44 which has a square hex adjacent to its top and which is inserted through a small square slot 45 in upper jaw 39 and a large slot 46 in lower jaw 40. The relative sizes of these slots permits the bolt to be movable within the lower jaw and provide superior clamping action between the jaws. A spring 47 is provided to surround the bolt in the area between the opposed jaws, and the end of the bolt which extends through aperture 46 is received by spacer 47 and butterfly nut 49, both of which serve to retain the jaws in any desired clamped position.

All of the aforementioned elements combine to provide the flashlight with three distinct capabilities. Firstly, the flashlight may be used in the conventional manner for illumination of a desired area. This is accomplished by the switching of the on-off switch 20, which is connected to a circuit which includes the copper bars 32, metal spring 18, batteries 28 as a source of current, discoidal metal contact 17, flashlight bulb 16 reflector 5 and annular metal contact plate 27.

Secondly, the combination flashlight can be utilized to perform a continuity test of a circuit which includes a disconnected electrical part with no resistance, e.g., a fuse, thermodisc, broken wire or other similar device. This is achieved by connecting the two testing cords 14 to the positive and negative spade connectors 22 and 21 which are located adjacent the switch. The other ends of the testing cords 14 are connected to the item being tested. If the circuit is complete, flashlight bulb 16 will go on to indicate continuity, while if the circuit is incomplete flashlight bulb 16 will remain darkened and indicate a discontinuity within the circuit. This circuit includes the same elements used to turn the flashlight on and off, using the flashlight batteries as a current source, with the exception that the spade connectors, testing cords and the item being tested replace switch 20. Accordingly, the switch 20 must be in the off position so that only the shorting out of the item being tested will complete the circuit and turn bulb 16 on.

Thirdly, the combination flashlight of the present invention can be utilized to test the continuity of an electric circuit in which the resistance is so high that it requires the use of an external source of current, such as a wall socket. For this test, neon test light 23 is used in conjunction with cheater cords 13. Cheater cords 13 are each comprised of a wire interposed between two electrical connectors in a fashion similar to conventional stereo speaker cords. Further, one of the cheater cords is provided with a plug to be inserted into a wall socket so as to provide the necessary source of external current to perform the test. One end of each of the cheater cords is respectively attached to one of the two spade connectors 24 located on the neon test light, while the other ends of the cheater cords are connected to an applicance to be tested. If the circuit which includes the applicance being tested is continuous, the neon test light bulb will shine; if the circuit which includes the applicance is discontinuous, the neon test light bulb will remain dark.

Alternatively, the combination flashlight of the present invention could be used as an emergency blinker light for automobiles, boats and the like. This use is achieved by simply attaching a conventional flasher to spade connectors 21 and 22 and snapping a colored lens adapter over screw on lens 38.

From the foregoing description, one skilled in the art can easily ascertain the essential characteristics of this invention, and without departing from the spirit and scope thereof, can make various changes and modifications of the invention to adopt it to various usages and conditions.

What is claimed is:

1. A combination flashlight and circuit tester, comprising:
    (a) A generally tubular housing for receiving a plurality of flashlight batteries end to end in electrical contact;
    (b) a screw-on lens at a first end of the housing;
    (c) a removable cap at a second, opposite end of the housing;
    (d) a reflector-light bulb assembly retained within the housing adjacent the screw-on lens;
    (e) an annular contact plate circumferentially engaging the reflector;
    (f) a discoidal battery contact plate interposed between and in direct contact with the bulb and the battery;
    (g) resilient means disposed within the housing adjacent the removable cap for urging the batteries into electrical contact with the discoidal contact plate;
    (h) electrical conductor means within the housing extending between the resilient means and the annular contact plate, comprising first and second electrically conductive metal bars disposed within the housing and spaced in an end to end relationship, the first bar extending from the annular contact plate toward the second bar and the second bar extending from the resilient means toward the first bar, the switch interconnecting the adjacent ends of the bars and said conductor means further including a switch for alternatively conducting or interrupting electrical current flow through an electrical circuit comprising the conductor means, the annular contact plate, the reflector, the bulb, the discoidal contact plate, the batteries and the resilient means;

(i) said conductor means including means for making an electrical connection with a circuit to be tested for electrical continuity wherein the conductor means and the connection means comprises a pair of spade connectors, one electrically connected to each bar on an opposite side of the switch, both spade connectors extending through the housing wall and projecting radially beyond the exterior surface of the housing a sufficient distance to be manually engaged and to facilitate connection with an exterior circuit, said switch being removably interconnected with each of the bars by engaging its second spade connector, whereby the switch may be readily replaced upon failure; and (j) means for supporting the flashlight/tester in any of a variety of positions comprising an elongate flexible metal rod attached at one end to the exterior surface of the housing and having a clamp at its opposite end, the rod being manually bendable to a variety of orientations but sufficiently resistant to bending to support the flashlight/tester from whatever structure to which it is clamped while maintaining the selected orientation.

2. The flashlight and circuit tester of claim 1 wherein the clamp comprises a pair of pivotally connected jaws normally spring biased to a closed position.

3. The flashlight and circuit tester of claim 1 wherein the clamp comprises a pair of pivotally connected jaws normally spring biased to an open position, said jaws being mechanically interconnected to enable clamping of the jaws against the action of the spring.

4. The flashlight and circuit tester of claim 3 wherein the jaw pair comprises lower and upper jaws, the lower jaw rigidly connected to the rod and the upper jaw pivotally interconnected with the lower jaws, and wherein the jaws are also interconnected by a bolt extending through the upper end lower jaws and threadedly engaging a nut below said lower jaw, the bolt including a section adjacent its head for mating with a similar aperture in the upper jaw, the lower jaw including a larger apperture for loosely receiving the bolt passing there through, a helical spring disposed between the upper and lower jaws normally urging those jaws apart, the spring axially receiving the bolt passing through the appertures.

5. The flashlight and circuit tester of claim 1 wherein the switch comprises a toggle switch which prevents unintended operation by requiring positive actuation.

6. The flashlight and circuit tester of claim 1 wherein the switch comprises a push button switch which prevents unintended operation by requiring positive actuation.

7. The flashlight and circuit tester of claim 1 wherein the spade connectors extending through the housing wall are frictionally engaged thereby and may be retracted therethrough facilitating replacement of the conductive bars.

8. The flashlight and circuit tester of claim 1 wherein the resilient means comprise a V-shaped steel spring hingedly connected at one end to the conductive bar adjacent the removable cap, the spring being swingable out of an interfering relationship with the batteries when the cap is removed from the housing.

9. The flashlight and circuit tester of claim 1 further comprising means for testing the continuity of a circuit while employing an external source of electrical current, said means comprising a neon test bulb having a pair of exposed spade contacts, said neon bulb being removeably mounted to the exterior surface of the housing.

10. The flashlight and circuit tester of claim 9 wherein a spring clip attached to the exterior surface of the housing removeably mounts the neon test bulb.

11. The flashlight and circuit tester of claim 9 wherein the removeable cap comprises a screw-on storage compartment, including an interior partition defining a pair of respective storage areas for receiving electrical cords used in conducting continuity tests with the flashlight and circuit tester, wherein one storage area stores a pair of testers for connecting the spade connectors on the conductive bars to a circuit to be tested and the other storage area stores a pair of cheater cords for connecting the spade connectors on the neon bulb to both an external source of power and to a circuit to be tested.

12. The combination flashlight and circuit tester of claim 1 further comprising means for testing continuity of a circuit while employing an external source of electrical energy, said means comprising a neon test bulb mounted to the exterior surface of the housing.

13. The combination flashlight and circuit tester of claim 12 further comprising a spring clip attached to the housing's exterior surface for removeably mounting the neon bulb.

14. The combination flashlight and circuit tester of claim 1 wherein the resilient means comprise a V-shaped steel spring hingedly connected at one end to the conductive bar adjacent the removeable cap, the spring being swingable out of an interfering relationship with the batteries when the rear cap is removed from the housing.

* * * * *